United States Patent
Jou et al.

(10) Patent No.: US 8,278,715 B2
(45) Date of Patent: Oct. 2, 2012

(54) ELECTROSTATIC DISCHARGE PROTECTION DEVICE

(75) Inventors: Yeh-Ning Jou, Linkou Township, Taipei County (TW); Chia-Wei Hung, Caotun Township, Nantou County (TW); Hwa-Chyi Chiou, Hsinchu (TW); Yeh-Jen Huang, Hsinchu (TW); Shu-Ling Chang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 13/019,846

(22) Filed: Feb. 2, 2011

(65) Prior Publication Data

US 2012/0193718 A1 Aug. 2, 2012

(51) Int. Cl.
*H01L 23/62* (2006.01)
*H01L 29/772* (2006.01)

(52) U.S. Cl. ........ 257/355; 257/107; 257/357; 257/360; 257/565; 257/E21.345; 257/E21.618; 257/E27.063; 257/E29.01; 257/E29.06; 438/133; 438/134; 438/155

(58) Field of Classification Search .................. 257/107, 257/355, 357, 360, 565, E21.345, E21.618, 257/E27.063, E29.01, E29.06; 438/133, 438/134, 155

See application file for complete search history.

(56) References Cited

U.S. PATENT DOCUMENTS

| | | | |
|---|---|---|---|
| 6,521,952 B1 * | 2/2003 | Ker et al. | 257/360 |
| 6,642,088 B1 * | 11/2003 | Yu | 438/155 |
| 7,838,937 B1 * | 11/2010 | Walker et al. | 257/355 |
| 2003/0122192 A1 * | 7/2003 | Ker et al. | 257/347 |
| 2012/0080716 A1 * | 4/2012 | Ker et al. | 257/107 |

* cited by examiner

*Primary Examiner* — Dao H Nguyen
(74) *Attorney, Agent, or Firm* — Birch, Stewart, Kolasch & Birch, LLP

(57) ABSTRACT

An ESD protection structure is disclosed. A substrate comprises a first conductive type. A first diffusion region is formed in the substrate. A first doped region is formed in the first diffusion region. A second doped region is formed in the first diffusion region. A third doped region is formed in the substrate. A first isolation region is formed in the substrate, covers a portion of the first diffusion region and is located between the second and the third doped regions. A fourth doped region is formed in the substrate. When the first doped region is coupled to a first power line and the third and the fourth doped regions are coupled to a second power line, an ESD current can be released to the second power line from the first power line. During the release of the ESD current, the second doped region is not electrically connected to the first power line.

9 Claims, 6 Drawing Sheets

ELECTROSTATIC DISCHARGE PROTECTION DEVICE

BACKGROUND OF THE INVENTION

1. Field of the Invention

The invention relates to a protection device, and more particularly to an electrostatic discharge (ESD) protection device.

2. Description of the Related Art

As the semiconductor manufacturing process develops, electrostatic discharge (ESD) protection becomes one of the most critical reliability issues for integrated circuits (IC). In particular, as the semiconductor process advances into the deep sub-micron stage, scaled-down devices and thinner gate oxides become more vulnerable to ESD stress.

Generally, the input/output pads on IC chips must at least sustain 2 kVolt of ESD stress of a high Human Body Mode (HBM) or 200V of ESD stress of a Machine Mode. Thus, the input/output pads on IC chips usually include ESD protect devices or circuits protecting the core circuit from ESD damage.

BRIEF SUMMARY OF THE INVENTION

In accordance with an embodiment, an ESD protection structure comprises a substrate, a first diffusion region, a first doped region, a second doped region, a third doped region, a first isolation region and a fourth doped region. The substrate comprises a first conductive type. The first diffusion region is formed in the substrate and comprises a second conductive type. The first doped region is formed in the first diffusion region and comprises the first conductive type. The second doped region is formed in the first diffusion region and comprises the second conductive type. The third doped region is formed in the substrate and comprises the second conductive type. The first isolation region is formed in the substrate, covers a portion of the first diffusion region and is located between the second and the third doped regions. The fourth doped region is formed in the substrate and comprises the first conductive type. When the first doped region is coupled to a first power line and the third and the fourth doped regions are coupled to a second power line, an ESD current can be released to the second power line from the first power line. During the release of the ESD current, the second doped region is not electrically connected to the first power line.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
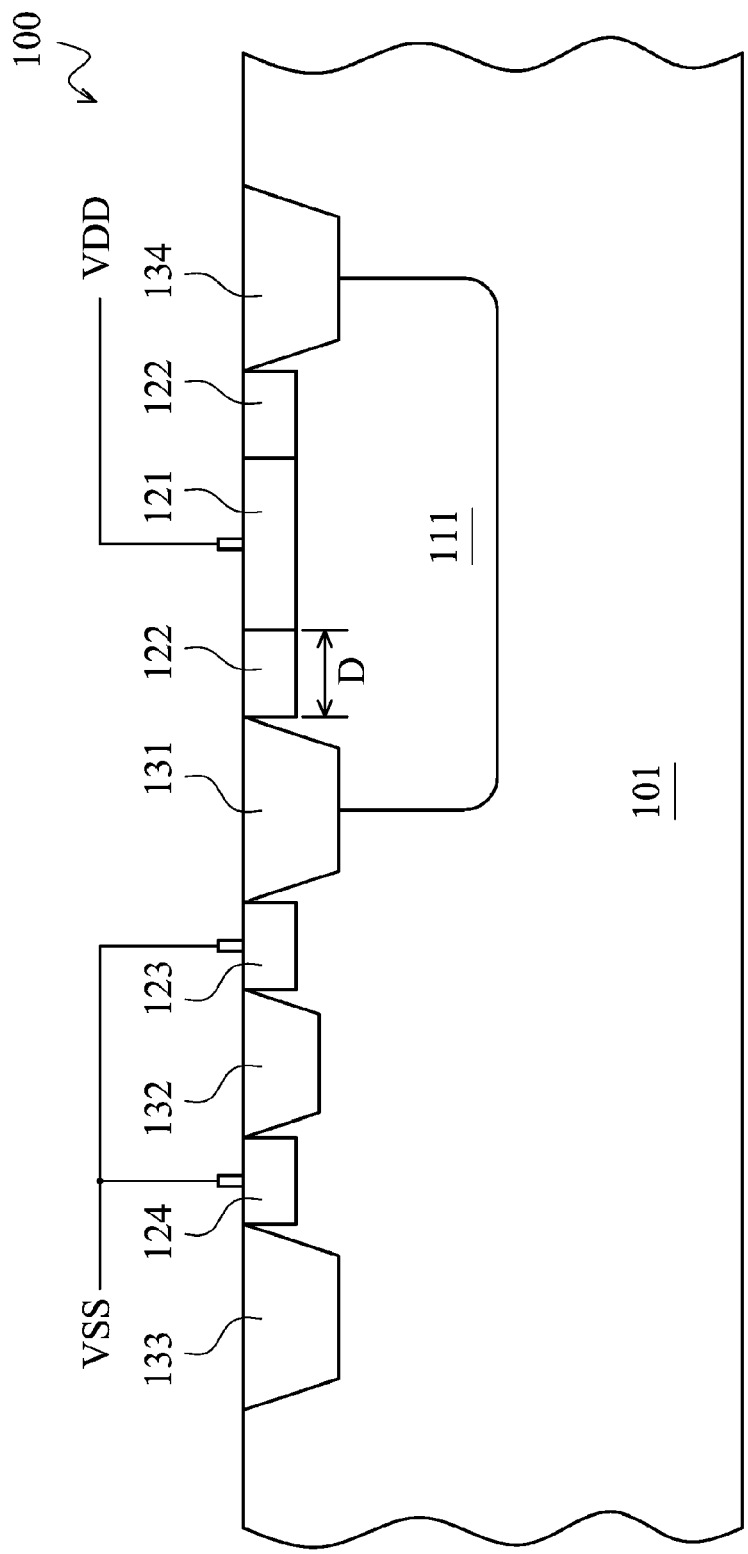
FIG. 1A is a schematic diagram of an exemplary embodiment of an ESD protection structure of the invention.

FIG. 1A is a schematic diagram of an exemplary embodiment of an ESD protection structure of the invention. The ESD protection structure 100 comprises a substrate 101, a diffusion region 111, doped regions 12~124 and an isolation region 131. The substrate 101 comprises a first conductive type. The diffusion region 111 is formed in the substrate 101 and comprises a second conductive type. In this embodiment, the first conductive type is a P-type, and the second conductive type is an N-type. In other embodiments, the first conductive type is an N-type, and the second conductive type is a P-type.

Figure 1B:
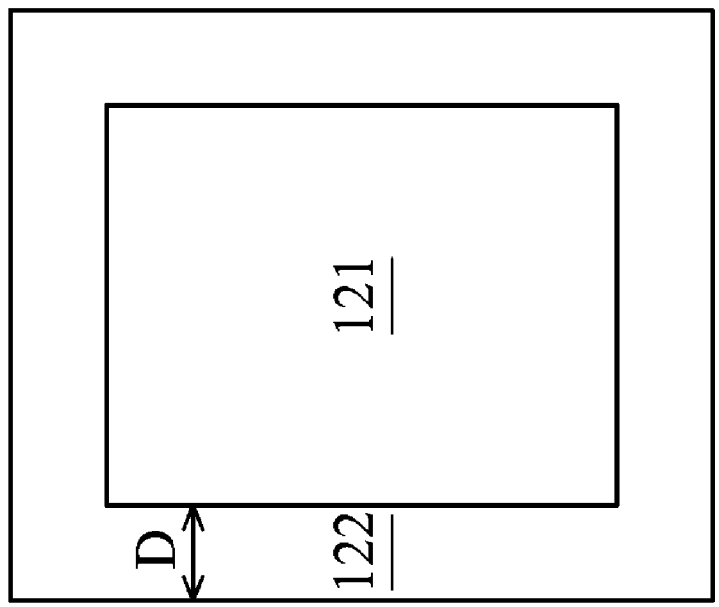
FIG. 1B is a top-view of the doped regions 121 and 122 shown in FIG. 1A.

The doped regions 121 and 122 are formed in the diffusion regions 111. In this embodiment, the doped region 121 comprises the first conductive type, and the doped region 122 comprises the second conductive type. FIG. 1B is a top-view of the doped regions 121 and 122 shown in FIG. 1A. The doped region 122 surrounds the doped region 121

As shown in FIG. 1A, the doped regions 123 and 124 are formed in the substrate 101. In this embodiment, the doped region 123 comprises the second conductive type, and the doped region 124 comprises the first conductive type.

The isolation region 131 is formed in the substrate 101 and covers a portion of the diffusion region 111. The isolation region 131 is located between the doped regions 122 and 123. The isolation region 131 is a shallow trench isolation (STI) or a field oxide (FOX). In this embodiment, the ESD protection structure 100 further comprises isolation regions 132~134. The isolation region 132 is disposed between the doped regions 123 and 124. The isolation region 133 is disposed on the left side of the doped region 124. The isolation region 134 is disposed on the right side of the doped region 122.

In this embodiment, the doped region 121 is coupled to a power line VDD, and the doped regions 123 and 124 are coupled to a power line VSS. When an ESD event occurs in the power line VDD and the power line VSS is grounded, beginning at the power line VDD, ESD current flows through the doped region 121, the diffusion region 111, the substrate 101, and the doped regions 123 and 124 and finally to the power line VSS to relate ESD stress. During the release of the ESD current, the doped region 122 is not electrically connected to the power line VDD.

Since the doped region 122 is disposed between the doped region 121 and the isolation region 131, the ESD current path is changed such that the isolation region 131 does not directly collide with the ESD current. Further, the width of the doped region 122 is adjusted to adjust a holding voltage of the ESD protection structure 100. In one embodiment, the width of the doped region 122 is about 0.5μ~5μ.

In this embodiment, the doped region 122 is disposed on the left side of the doped region 121 and simultaneously contacts the isolation region 131 and the doped region 121. A gap occurs between the doped region 122 and at least one of the isolation region 131 and the doped region 121.

Figure 2:
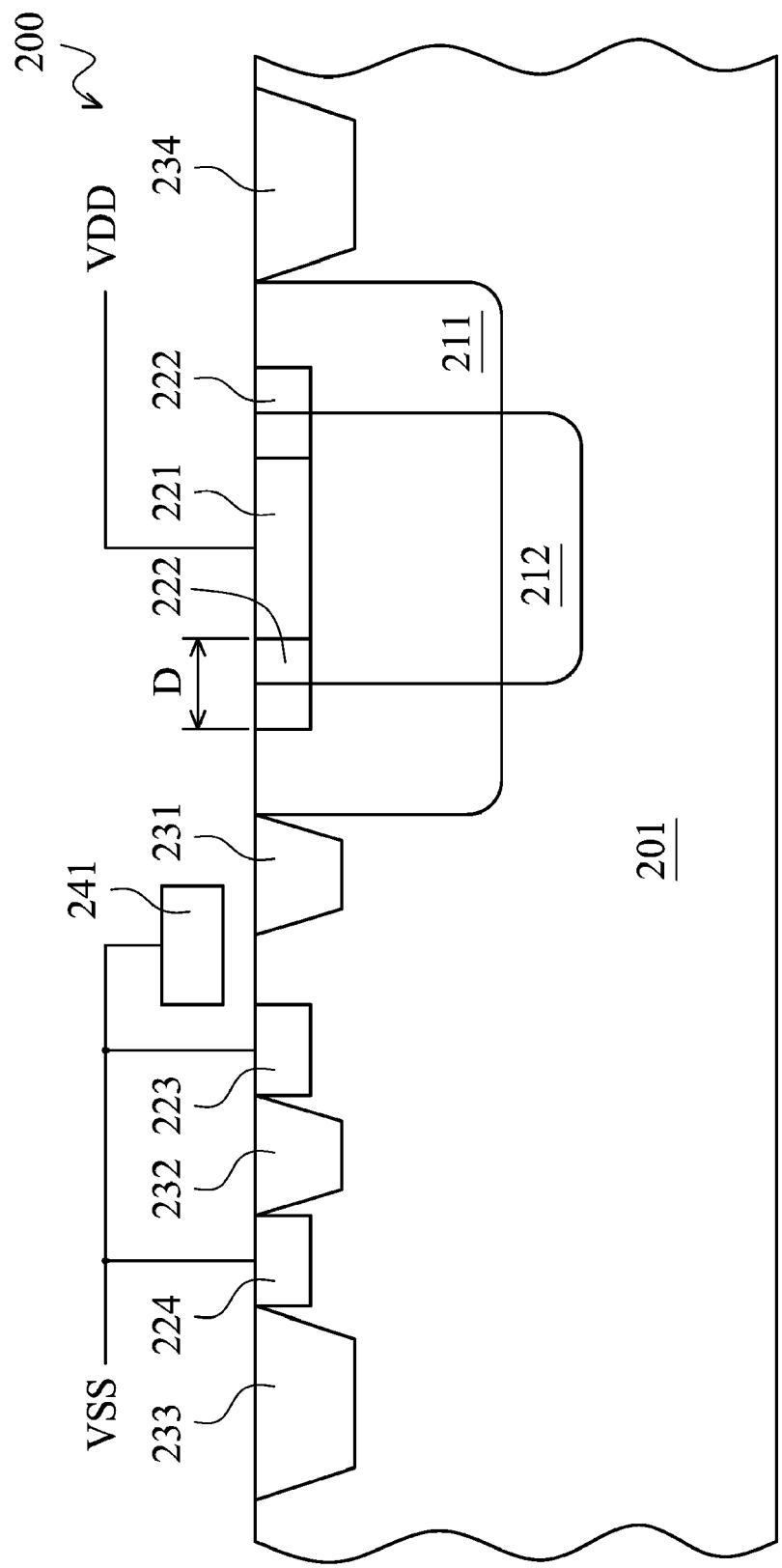
FIGS. 2, 3A, 3B and 4 are schematic diagrams of other exemplary embodiments of ESD protection structures of the invention.

FIG. 2 is a schematic diagram of another exemplary embodiment of an ESD protection structure. FIG. 2 is similar to FIG. 1A except for the addition of a well 212 and a gate 241. The substrate 201, the diffusion region 211, the doped regions 221~224 and isolation regions 231~234 are the same as the substrate 101, the diffusion region 111, the doped regions 121~124 and the isolation regions 131~134. Thus, the descriptions of the substrate 201, the diffusion region 211, the doped regions 221~224 and isolation regions 231~234 are omitted for brevity.

As shown in FIG. 2, the well 212 is formed in the substrate 201 and comprises the second conductive type. A portion of the diffusion region 211 and a portion of the doped region 222 are formed in the well 212. The doped region 221 is formed in the well 212. In this embodiment, the conductive types of the well 212, the diffusion region 211 and the doped region 222 are the same. In one embodiment, a doped concentration of the doped region 222 is high. Thus, the doped region 222 can be referred to as an N+ region. The diffusion region 211 is an N-type drain drift (NDD). The well 212 is an N-type well (NW).

The gate 241 is formed on the substrate 201 and is located between the isolation region 231 and the doped region 223. The gate 241 covers a portion of the isolation region 231. The gate 241 and the doped regions 221, 223 and 224 constitute a double diffused drain MOSFET (DDMOSFET). In this embodiment, the doped region 221 serves as a drain of the DDMOSFET, the doped region 223 serves a source of the DDMOSFET, and the doped region 224 serves as a bulk of the DDMOSFET.

Additionally, the gate 241 is coupled to the power line VSS, and the doped region 222 does not electrically connect to the power line VDD during the release of the ESD current. In one embodiment, the doped region 222 is at a floating state during the release of the ESD current.

In this embodiment, a gap occurs between the doped region 222 and the isolation region 231. The width of the doped region 222 can be adjusted to control and adjust the holding voltage of the ESD protection structure 200.

Figure 3A:
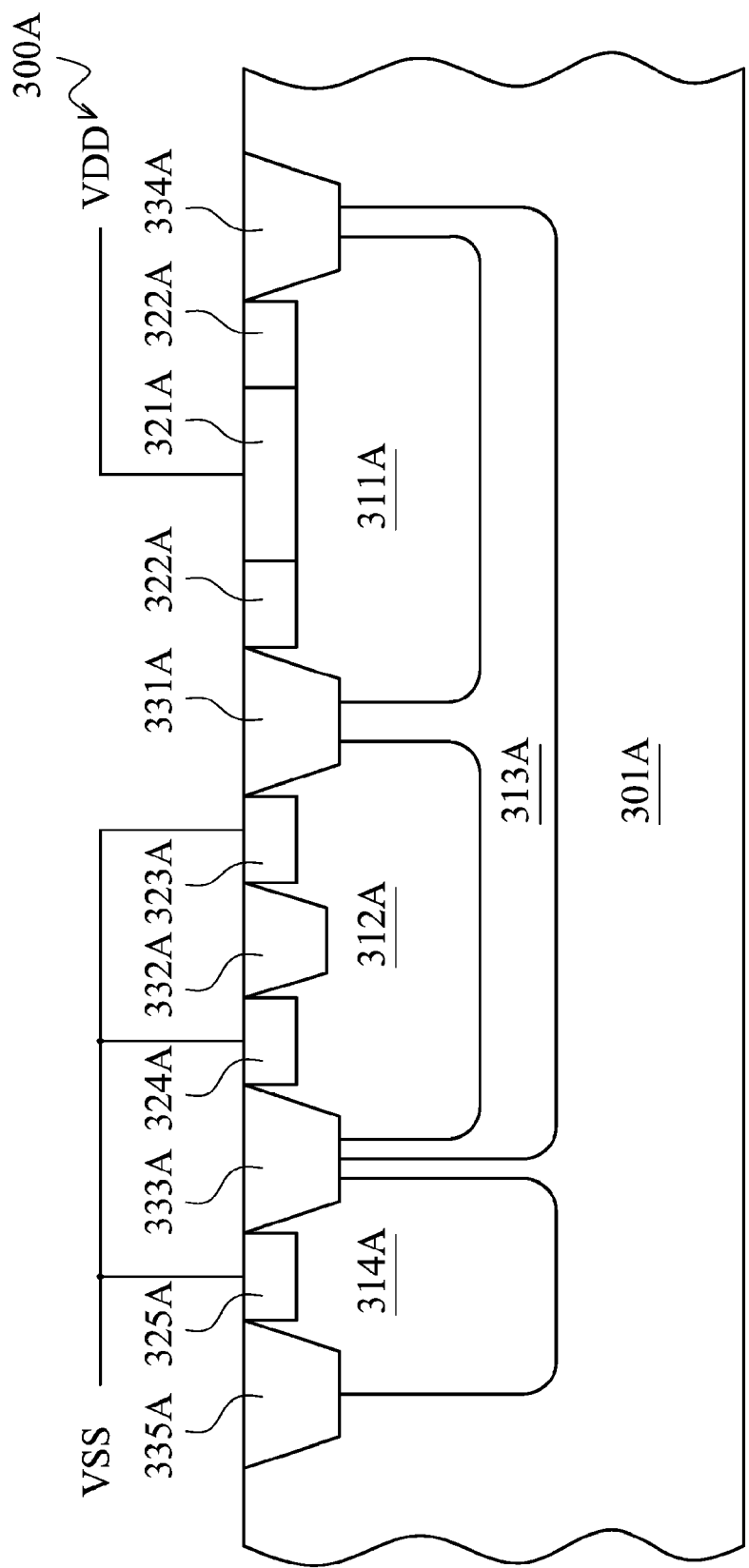

FIG. 3A is a schematic diagram of another exemplary embodiment of an ESD protection structure. FIG. 3A is similar to FIG. 1A except for the addition of diffusion regions 312A~314A and a doped region 325A.

The diffusion region 312A is formed in the diffusion region 313A and comprises the first conductive type. In this embodiment, the doped regions 323A, 324A and the isolation regions 332A are formed in the diffusion region 312A. In one embodiment, doped concentration of the diffusion region 312A is less than that of the doped region 324A.

The diffusion region 313A is formed in the substrate 301A and comprises the second conductive type. In this embodiment, the diffusion regions 311A and 312A are formed in the diffusion region 313A. In one embodiment, the diffusion region 311A is an N-type drain drift (NDD) region, and the diffusion region 313A is a high voltage N-type well (HVNW).

The diffusion region 314A is formed in the substrate 301A and comprises the first conductive type. The doped region 325A is formed in the diffusion region 314A and comprises the first conductive type. The doped region 325A serves a metal contact of the diffusion region 314A. In one embodiment, the doped region 325A is a high voltage P-type well (HVPW).

In this embodiment, the doped regions 323A, 324A and 325A are coupled to the power line VSS, and the doped region 321A is coupled to the power line VDD. The doped region 322A is not coupled to the power line VDD. The doped region 322A is utilized to avoid direct collision of ESD current, coming from the power line VDD, with the isolation region 331A such that the holding voltage of the ESD protection structure 300A is increased.

Figure 3B:
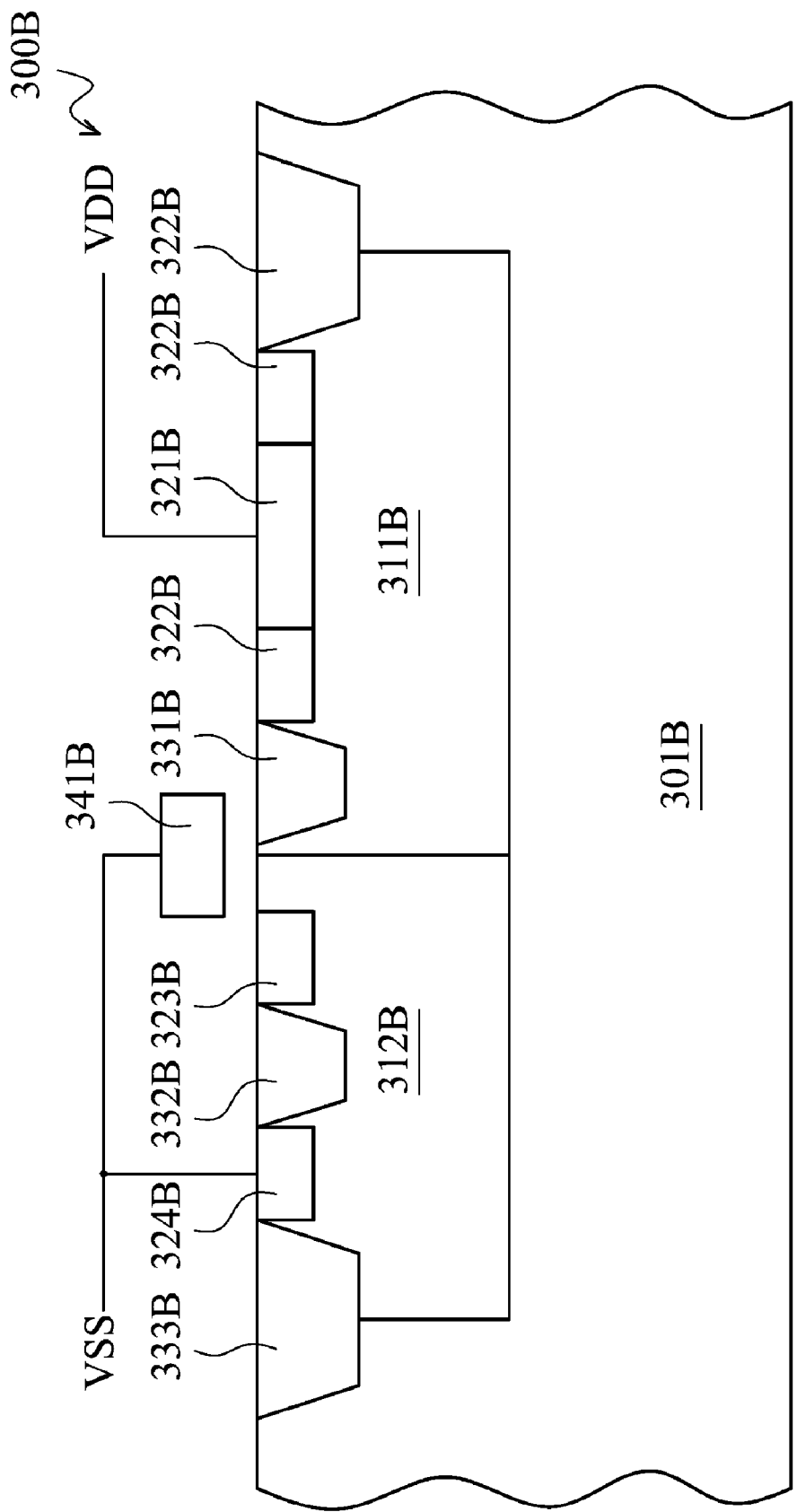

FIG. 3B is a schematic diagram of another exemplary embodiment of an ESD protection structure. FIG. 3B is similar to FIG. 3A except for the addition of a gate 341B. The gate 341B is formed on the diffusion regions 311B and 312B and covers a portion of the doped region 323B and isolation region 331B.

In this embodiment, a gap occurs between the isolation region 331B and the doped region 323B. The gate 341B, and doped regions 321B, 323B and 324B constitute a laterally diffused metal oxide semiconductor (LDMOS) transistor. During the release of the ESD current, the gate 341B is coupled to the power line VSS, and the doped region 322B is not coupled to the power line VDD.

In this embodiment, the diffusion region 311B comprises the second conductive type, and the diffusion region 312B comprises the first conductive type. In one embodiment, the diffusion region 311B is an HVNW, and the diffusion region 312B is an HVPW.

Figure 4:
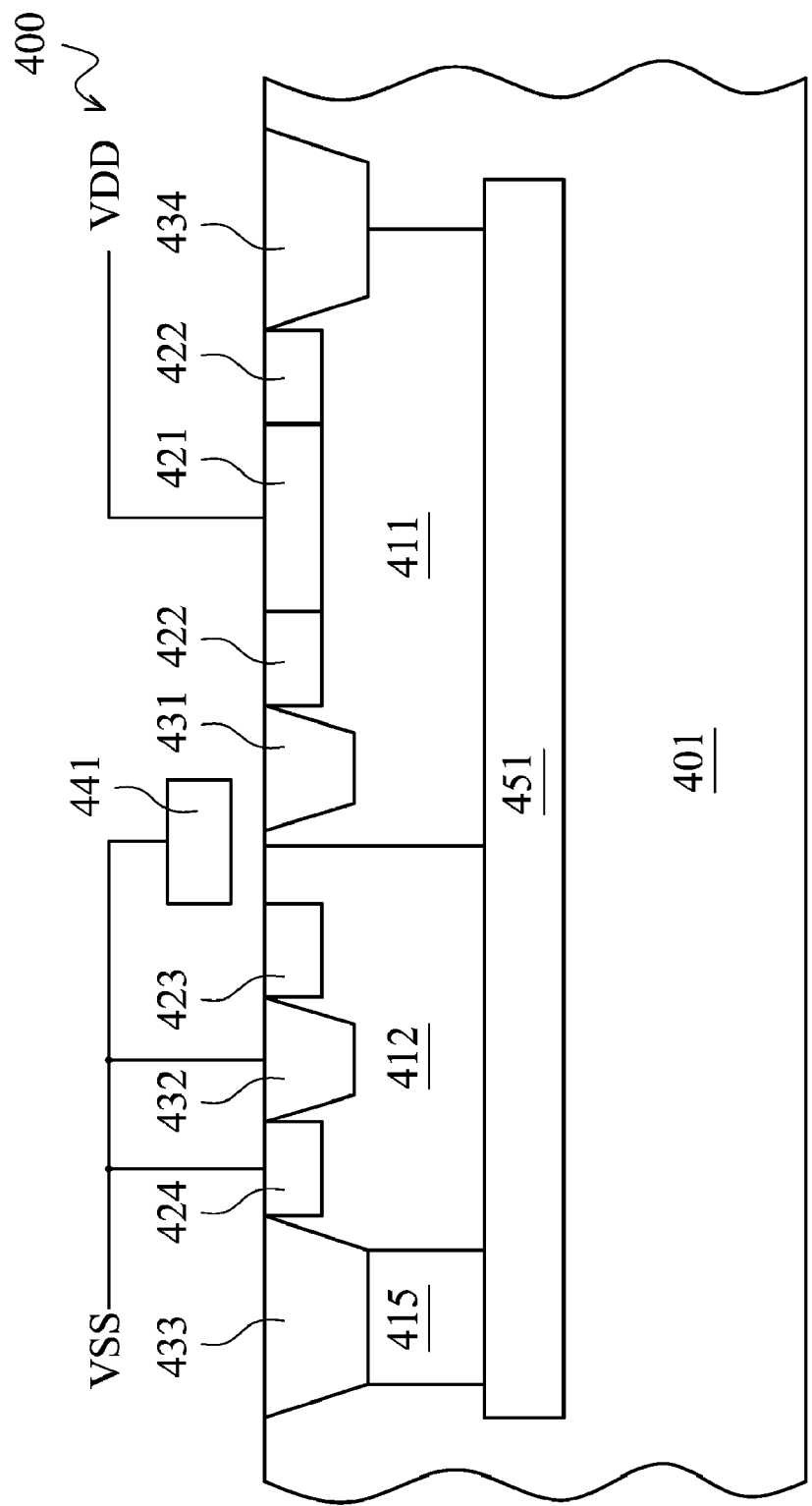

FIG. 4 is a schematic diagram of another exemplary embodiment of an ESD protection structure. FIG. 4 is similar to FIG. 3B except for the addition of a buried layer 451. In this embodiment, the buried layer 451 is formed in the substrate 401 and comprises the second conductive type. The diffusion regions 411, 412 and 415 are formed on the buried layer 451.

In one embodiment, the buried layer 451 is an N-type buried layer. In this embodiment, the diffusion regions 411 and 415 are HVNWs, and the diffusion region 412 is an HVPW.

In this embodiment, the doped region 421 is coupled to the power line VDD. The doped regions 423, 424 and the gate 441 are coupled to the power line VSS. Since the doped region 422 is formed between the doped region 421 and the isolation region 431, the released ESD current does not collide with the isolation region 431 to increase the holding voltage of the ESD protection structure 400.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge (ESD) protection structure, comprising:
   a substrate comprising a first conductive type;
   a first diffusion region formed in the substrate and comprising a second conductive type;
   a first doped region formed in the first diffusion region and comprising the first conductive type;
   a second doped region formed in the first diffusion region and comprising the second conductive type, wherein the second doped region surrounds the first doped region;
   a third doped region formed in the substrate and comprising the second conductive type;
   a first isolation region formed in the substrate, covering a portion of the first diffusion region and located between the second and the third doped regions; and
   a fourth doped region formed in the substrate and comprising the first conductive type,
   wherein when the first doped region is coupled to a first power line, and the third and the fourth doped regions are coupled to a second power line, an ESD current can be released to the second power line from the first power line, and wherein during the release of the ESD current, the second doped region is not electrically connected to the first power line.

2. The ESD protection structure as claimed in claim 1, further comprising:

a well formed in the substrate and comprising a second conductive type, wherein a first portion of the first diffusion region and a first portion of the second doped region are formed in the well, a second portion of the first diffusion region and a second portion of the second doped region are not formed in the well, and the first doped region is formed in the well; and a gate formed in the substrate, located between the first isolation region and the third doped region, and covering a portion of the first isolation region, wherein the gate, and the first, the third and the fourth doped regions constitute a double diffused drain MOSFET, and wherein during the release of the ESD current, the gate is coupled to the second power line.

3. The ESD protection structure as claimed in claim 1, further comprising:

a second diffusion region formed in the substrate and comprising the first conductive type, wherein the third and the fourth doped regions are formed in the second diffusion region; and a third diffusion region formed in the substrate and comprising the second conductive type, wherein the first and the second diffusion regions are formed in the third diffusion region.

4. The ESD protection structure as claimed in claim 3, wherein the first diffusion region is an N-type drain drift (NDD) region, and the third diffusion region is a high voltage N-type well (HVNW).

5. The ESD protection structure as claimed in claim 1, further comprising:

a second diffusion region formed in the substrate and comprising a first conductive type, wherein the third and the fourth doped regions are formed in the second diffusion region; and a gate formed on the first and the second diffusion regions and covering a portion of the first diffusion region and a portion of the second diffusion region, wherein the gate, and the first, the third and the fourth doped regions constitute a laterally diffused metal oxide semiconductor (LDMOS) transistor, and wherein the gate is coupled to the second power line during the release of the ESD current.

6. The ESD protection structure as claimed in claim 1, further comprising:

a second diffusion region formed in the substrate and comprising the first conductive type, wherein the third and the fourth doped regions are formed in the second diffusion region; and a buried layer formed in the substrate and comprising the second conductive type, wherein the first and the second diffusion regions are formed on the buried layer.

7. The ESD protection structure as claimed in claim 6, wherein the first diffusion region is a high voltage N-type well (HVNW), and the second diffusion region is a high voltage P-type well (HVPW).

8. The ESD protection structure as claimed in claim 1, wherein the second doped region contacts at least one of the first doped region and the first isolation region.

9. The ESD protection structure as claimed in claim 1, wherein a gap occurs between the second doped region and at least one of the first doped region and the first isolation region.

* * * * *